United States Patent
Silva et al.

(10) Patent No.: US 8,665,128 B2
(45) Date of Patent: *Mar. 4, 2014

(54) SIGMA-DELTA DIFFERENCE-OF-SQUARES LOG-RMS TO DC CONVERTER WITH FORWARD PATH MULTIPLIER AND CHOPPER STABILIZATION

(75) Inventors: Paulo Gustavo Raymundo Silva, Delft (NL); Michael Hendrikus Laurentius Kouwenhoven, Morgan Hill, CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 12/963,265

(22) Filed: Dec. 8, 2010

(65) Prior Publication Data

US 2012/0146819 A1   Jun. 14, 2012

(51) Int. Cl.
*H03M 3/00* (2006.01)
(52) U.S. Cl.
USPC ........... 341/143; 341/155; 327/179; 327/348; 327/349; 375/316; 375/296; 455/296; 455/311; 455/226.1
(58) Field of Classification Search
USPC .................. 341/140–160; 327/179, 348, 349; 455/296, 311, 226.1; 375/316
See application file for complete search history.

(56) References Cited

U.S. PATENT DOCUMENTS

| | | | |
|---|---|---|---|
| 3,562,552 A | 2/1971 | Baudino | |
| 3,657,528 A | 4/1972 | Plante | |
| 5,585,757 A | 12/1996 | Frey | |
| 5,896,056 A | 4/1999 | Glucina | |
| 6,172,549 B1 * | 1/2001 | Gilbert | 327/349 |
| 6,204,719 B1 * | 3/2001 | Gilbert | 327/349 |
| 6,348,829 B1 | 2/2002 | Gilbert | |
| 6,359,576 B1 * | 3/2002 | Petrofsky | 341/143 |
| 6,429,720 B1 | 8/2002 | Gilbert | |
| 6,437,630 B1 | 8/2002 | Gilbert | |
| 6,549,057 B1 * | 4/2003 | Gilbert | 327/349 |
| 6,584,157 B1 * | 6/2003 | Van Der Zwan et al. | 375/247 |
| 7,002,394 B1 * | 2/2006 | Gilbert | 327/349 |
| 7,106,604 B2 | 9/2006 | Nash | |
| 7,197,292 B1 * | 3/2007 | Kouwenhoven et al. | 455/311 |
| 7,545,302 B1 * | 6/2009 | Silva et al. | 341/143 |
| 7,545,303 B1 * | 6/2009 | Silva et al. | 341/143 |

(Continued)

OTHER PUBLICATIONS

James C. Candy. "A Use of Limit Cycle Oscillations to Obtain Robust Analog-to-Digital Converters". IEEE Journal of Solid-State Circuits, vol. 22, No. 3, Mar. 1974, pp. 298-305.

(Continued)

*Primary Examiner* — Lam T Mai
(74) *Attorney, Agent, or Firm* — Andrew Viger; Wade J. Brady, III; Frederick J. Telecky, Jr.

(57) ABSTRACT

A sigma-delta ($\Sigma\Delta$) difference-of-squares LOG-RMS to digital converter for true RMS detection by merging a $\Sigma\Delta$ modulator with an analog LOG-RMS to DC converter based on a difference-of-squares. Chopper-stabilization, implemented through commutators running at two different frequencies, can be employed to reduce sensitivity to DC offsets and low-frequency errors, resulting in an extension of the useful input-referred dynamic range. High-order $\Sigma\Delta$ LOG-RMS converters can be implemented with a loop filter containing multiple integrators and feedforward and/or feedback paths for frequency compensation. The resulting implementations are $\Sigma\Delta$ difference-of-squares LOG-RMS to DC converters with a natural digital output and a logarithmically compressed dynamic range.

17 Claims, 10 Drawing Sheets

(56) References Cited

U.S. PATENT DOCUMENTS

| | | |
|---|---|---|
| 7,697,909 B2 | 4/2010 | Kouwenhoven |
| 2004/0223349 A1 | 11/2004 | Nash |
| 2007/0270116 A1 | 11/2007 | Kouwenhoven |
| 2009/0072874 A1 | 3/2009 | Sundstrom |

OTHER PUBLICATIONS

S. Norsworthy, R. Schreier, G. Temes. "Delta-Sigma Data Converters-Theory, Design, and Simulation". IEEE Press, 1997.

Barrie Gilbert. "A novel technique for RMS-DC conversion based on the difference of squares". Electronics Letters, vol. 11, No. 8, Apr. 17, 1975, pp. 181-182.

Rudy van de Plassche. "CMOS Integrated Analog-to-Digital and Digital-to-Analog Converters". Kluwer Academic Publishers, 2003.

M.H.L. Kouwenhoven and A. van Staveren. "Mean-Square Power Dectector with Integrated Offset Chopper". ISSCC Digest of Technical papers, pp. 92-93, Feb. 2005.

\* cited by examiner

SIGMA-DELTA DIFFERENCE-OF-SQUARES LOG-RMS TO DC CONVERTER WITH FORWARD PATH MULTIPLIER AND CHOPPER STABILIZATION

BACKGROUND

1. Field of the Invention

The present invention relates to sigma-delta modulators, and in particular, to sigma-delta modulators used for converting root-mean-square (RMS) signal values to direct current (DC) signals.

2. Related Art

The Sigma-Delta (ΣΔ) modulator is an electronic system that generates a digital output at very high resolution within a narrow bandwidth. The analog input is oversampled at a sampling rate ($f_S$) much larger than the required Nyquist rate ($f_N$), and it is coded as a bitstream with reduced number of (M) bits. As illustrated by FIG. 1, it contains a lowpass loop filter (LPF) and a coarse M-bit analog-to-digital converter (ADC) in the feedforward path (quantizer), and a digital-to-analog converter (DAC) in the feedback path. In order to produce a Nyquist rate output, the modulator is generally followed by a digital decimator. The decimator also filters the high-frequency noise and increases the length of the output digital word. The combination of a ΣΔ modulator with a digital decimation filter is named ΣΔ ADC. It is used in a large range of applications that require high resolution in a limited bandwidth, such as sensor interfaces, digital telecommunication receivers, precision applications and dc measurements.

The principle of operation of a ΣΔ modulator is better understood with the aid of a linearized model, depicted in FIG. 2. In this Laplace-domain model, L(s) is the loop filter transfer function and the feedback factor b express the ratio between ADC and DAC reference voltages. The analog-to-digital conversion of the loop filter output U(s) is modeled as an addition of quantization error Q(s). When a multi-bit quantizer is employed, the quantization error can be assumed to be a white noise source with a flat power spectrum density (PSD). The total quantization noise power ($q_{RMS}^2$) is independent of $f_S$, and it is given by:

$$q_{RMS}^2 = \frac{\Delta^2}{12} = \frac{V_{REF}^2}{12 \cdot (2^M - 1)^2} \qquad (1)$$

where Δ is the quantization step and $V_{REF}$ is the ADC reference voltage.

The modulator output Y(s) can be expressed as:

$$Y(s) = \frac{1}{1+bL(s)} \cdot Q(s) + \frac{L(s)}{1+bL(s)} \cdot X(s) \qquad (2)$$

where the term multiplying Q(s) is the noise transfer function (NTF), and the term multiplying X(s) is the signal transfer function (STF). When L(s) is a lowpass transfer function with very high DC gain, the STF is lowpass transfer function with 1/b gain at low frequencies, while the NTF is a highpass transfer function. FIG. 3 shows the typical digital output spectrum of a ΣΔ modulator when the analog input X(s) is a band-limited ($f_B = f_N/2$) low-frequency signal.

At low frequencies, the modulator output contains an undistorted replica of the analog input while the quantization noise is strongly attenuated. If the spectral content of the modulator output containing most of the shaped quantization noise power ($n_{RMS}^2$) is filtered out in the digital domain, very high resolution analog-to-digital conversion is achieved. The shaped quantization noise power after digital filtering is given by:

$$n_{RMS}^2 = \frac{q_{RMS}^2}{f_S} \cdot \int_{-f_B}^{f_B} \left| \frac{1}{1+bL(2\pi f)} \right|^2 df \qquad (3)$$

The noise shaping of the quantization errors and the digital filtering of the out-of-band noise are possible because $f_S \gg f_N = 2f_B$, i.e., the analog input is oversampled. The oversampling ratio (OSR) is defined as:

$$OSR = f_S/2f_B \qquad (4)$$

The simplest implementation of a ΣΔ modulator is achieved when the loop filter is a single integrator and a comparator is used as quantizer (FIG. 4). In this case, it is named single-bit $1^{st}$-order ΣΔ modulator and the digital output is a bitstream.

A multi-bit ΣΔ modulator is implemented if a multi-bit ADC is used as quantizer, and a multi-bit DAC is employed in the feedback path. High-order noise shaping is achieved when the loop filter contains two or more integrators. The loop filter of a bandpass ΣΔ modulator contains high-frequency resonator stages instead of integrators. The in-band shaped quantization noise power of an M-bit ΣΔ modulator implemented with a cascade of P integrators is generically expressed by:

$$n_{RMS}^2 = \frac{V_{REF}^2}{12 \cdot (2^M - 1)^2} \cdot \frac{\pi^{2P}}{(2P+1) \cdot OSR^{2P+1}} \qquad (5)$$

LOG-RMS to DC converters are electronic circuits that generate a DC output signal (either current or voltage), proportional to the logarithmic of the Root-Mean-Square (RMS) value (the square-root of the power) of the input signal. Such devices are used in a variety of applications, such as test and measurement, and communications, where a measure of the signal strength is important. In general, the response of RMS-measuring devices is insensitive to the precise shape of the input signal; i.e., it is insensitive to crest factor variations. This is especially important in applications were the converter input signals can attain multiple different formats (modulation parameters, variable coding, etc. . . . ). A specific property of LOG-RMS to DC converters is the compression of the output dynamic range enabled by the logarithmic function. LOG-RMS detectors can be implemented based on the explicit calculation of the input RMS level, or based on implicit calculation.

Explicit calculation is the most straight-forward method of implementing a LOG-RMS to DC converter, and it is illustrated in FIG. 5. The input signal is squared, low-pass filtered and the square-root operation is calculated. Finally, the logarithmic function is applied. The overall transfer of this converter can be expressed as:

$$y = K_{log} \cdot \text{Log}\left( K_{sqrt} \sqrt{K_{sq} x^2} \right) \qquad (6)$$

and is thus dependent on all conversion gains from the input to the output ($K_{sq}$, $K_{sqrt}$ and $K_{log}$). Therefore, the overall transfer is subject to temperature drift, frequency dependence and other sources of inaccuracy resulting from each of the converter's analog building blocks. Examples of explicit LOG-RMS to DC converters are known in the art. Since the signal of interest at the output (y) is situated at DC, offsets adding to the internal node voltages significantly limit the sensitivity of the converter for small input signals. An improved architecture for explicit LOG-RMS conversion is based on LOG-domain signal operations. In this case, the dynamic range requirements of the internal nodes are also reduced by logarithmic compression.

A LOG-RMS to DC converter can be implemented implicitly by means of a feedback loop. The main advantage of this method is the extension of the input-referred dynamic range. This is possible because the dynamic range requirements of the internal nodes are greatly reduced compared to the case of explicit RMS computation. FIG. 6 describes an example of implicit LOG-RMS detector based on LOG-domain operations.

Both the RMS and the LOG-RMS levels of the input signal are measured by this system:

$$y_1 = \sqrt{\overline{x(t)^2}} = x_{RMS} \tag{7}$$

$$y_2 = \text{Ln}\left(\sqrt{\overline{x(t)^2}}\right) = \text{Ln}(x_{RMS}) \tag{8}$$

The main disadvantage of this implementation is the difficulty to realize high input-bandwidths, due to the fact that most of the signal-processing is carried out in the LOG-domain.

FIG. 7 depicts a LOG-RMS to DC converter based on the "difference-of-squares" technique. This architecture was first described in the context of linear RMS to DC conversion, and latter extended to LOG-RMS computation by means of an additional exponential conversion-gain in the feedback path. In this configuration, a linear analog multiplier is used to generate the difference of the square of the input signal and the square of the feedback signal, i.e. $K_m[\beta_x^2 x^2 - \beta_y^2 w^2]$. This is achieved by supplying one multiplier input with the sum of the input signal and the output signal, and the other input with the difference of these signals. The resulting difference of squares is then integrated, producing in the steady-state situation a dc level proportional to the logarithm of the true RMS value of the input signal. The integrator acts as a lowpass filter followed by an amplifier with high gain A. The lowpass filter removes the harmonics of the squared input signal, while the high gain forces the multiplier output to be zero.

The relation between the converter DC output y and the RF input signal x(t) can be calculated based on the analysis of block diagram shown in FIG. 7:

$$y = AK_m[\beta_x^2\overline{x(t)^2} - \beta_y^2 w^2] = AK_m\left[\beta_x^2\overline{x(t)^2} - \beta_y^2 V_o^2 \text{Exp}\left(\frac{2y}{V_i}\right)\right] \tag{9}$$

where $K_m$ is the multiplier conversion gain. The static transfer function of the difference-of-squares LOG-RMS to DC converter is obtained by solving (9) with the assumption that the dc gain A of the integrator approaches infinity:

$$\lim_{A\to\infty} y = V_i \ln\left(\frac{\beta_x}{\beta_y} \cdot \frac{x_{RMS}}{V_o}\right) \tag{10}$$

At low frequencies, where the feedforward gain $AK_m$ is very high, the difference-of-squares LOG-RMS to DC converter static transfer is independent of the multiplier conversion gain. It is only determined by the scaling factors $\beta_x$, $\beta_y$, $V_o$ and $V_i$.

An RMS to DC converter based on the difference-of-squares principle can also be implemented using two matched squaring circuits. The addition of an exponential conversion-gain in the feedback path (FIG. 8) transforms this system in a LOG-RMS to DC converter.

The relation between the converter DC output y and the RF input signal x(t) can be calculated based on the analysis of block diagram shown in FIG. 8:

$$y = A[K_x\overline{x(t)^2} - K_y w^2] = A\left[K_x\overline{x(t)^2} - K_y V_o^2 \text{Exp}\left(\frac{2y}{V_i}\right)\right] \tag{11}$$

where $K_x$ and $K_y$ are the conversion gains of the squaring cells. Again, the static transfer function of the difference-of-squares RMS-to-DC converter is obtained by solving (11) with the assumption that the dc gain A of the integrator approaches infinity:

$$\lim_{A\to\infty} y = V_i \ln\left(\sqrt{\frac{K_x}{K_y}} \cdot \frac{x_{RMS}}{V_o}\right) \tag{12}$$

The difference-of-squares LOG-RMS to DC converters shown in FIGS. 7 and 8 present a wide operation bandwidth, allowing RMS detection of RF inputs, and a large input-referred dynamic range due to the implicit calculation of the LOG-RMS level.

An implicit LOG-RMS to DC converter can be implemented when a squaring cell is driven by a variable gain amplifier (VGA), as depicted in FIG. 9. The VGA gain is inversely proportional to the detector DC output y. Because an exponential function is placed in the feedback path, the overall converter transfer function becomes proportional to the logarithm of the input RMS level. The output of the detector cell in the forward path is proportional to the square of the input RF signal x(t) divided by the square of the feedback signal w. A low-pass filter (LPF) removes the frequency content above DC from the squaring cell output. The integrator input e consists of the low-pass filter output subtracted by a squared reference level $K_r \cdot R^2$:

$$e = K_x \cdot \frac{\overline{x(t)^2}}{w^2} - K_r \cdot R^2 \tag{13}$$

Assuming that the integrator acts as another low-pass filter followed by a high DC gain A, the relation between the converter DC output y and the RF input signal x(t) can be calculated:

$$y = A \cdot \overline{e} = A\left[K_x \overline{\frac{x(t)^2}{w^2}} - K_r R^2\right] \quad (14)$$

where $K_x$ and $K_y$ are the conversion gains of the squaring cells. The steady-state value of the feedback signal w is calculated by solving (14) with the assumption that A is infinite:

$$\lim_{A \to \infty} w = \sqrt{\frac{K_x}{K_R}} \cdot \frac{x_{RMS}}{R} \quad (15)$$

When the exponential relation between w and y is taken in account ($w = \text{Exp}(y/V_t)$), the detector output can be calculated:

$$\lim_{A \to \infty} y = V_t \ln\left(\sqrt{\frac{K_x}{K_y}} \cdot \frac{x_{RMS}}{R}\right) \quad (16)$$

The ΣΔ modulator can be combined with the difference-of-squares RMS to DC converter in order to obtain an RMS to DC converter with intrinsic digital output. This mixed-signal system is named ΣΔ difference-of-squares RMS to DC converter as described in U.S. Pat. Nos. 7,545,302 and 7,545,303. In this architecture, the measured RMS level of the RF input is coded as the DC level of the modulator digital output bitstream y[k]. The ΣΔ RMS to DC converter can be implemented around a forward path multiplier as depicted in FIG. 10, or based on feedforward and feedback signal squaring operations.

The large-signal operation of ΣΔ RMS to DC converters is very similar to the operation of their analog counterparts. In FIG. 10, the error signal e(t) is also proportional to the difference between the squared input signal $x(t)^2$ and the squared analog feedback signal $y(t)^2$. The relation between y(t), the analog input x(t), and the integrator output u(t) can be calculated:

$$\frac{u(t)}{A} = K_m\left(\beta_x^2 \cdot \overline{x(t)^2} - \beta_y^2 \overline{y(t)^2}\right) = K_m\left(\beta_x^2 \cdot \overline{x(t)^2} - \beta_y^2\left[y_{DC}^2 + \overline{q(t)^2}\right]\right) \quad (17)$$

where $y(t) = y_{DC} + q(t)$ is the analog version of the digital output y[k] and q(t) is the quantization error added during the internal analog-to-digital conversion of the integrator output u(t). Assuming that the integrator DC-gain A approaches infinity, the large-signal static transfer of the ΣΔ difference-of-squares RMS-to-DC converter (FIG. 10) can be obtained by solving (17):

$$\lim_{A \to \infty} y_{DC} = \sqrt{\frac{\beta_x^2}{\beta_y^2} \overline{x(t)^2} - \overline{q(t)^2}} = \sqrt{\frac{\beta_x^2}{\beta_y^2} x_{RMS}^2 - q_{RMS}^2} \quad (18)$$

The steady-state DC solution for the ΣΔ RMS-to-DC converter depicted in FIG. 10 is very similar to the solution obtained for analog RMS-to-DC converters. The major difference is the additional term accounting for the quantization error mean-square value $q_{RMS}^2$. This term arises from the fact that the feedback bitstream, containing both the measured RMS level at DC and the added quantization error at high frequencies, is squared. In practice, the value of $q_{RMS}^2$ influences the law-conformance error for small input-power levels and defines the lower limit of the input-referred dynamic range.

SUMMARY

In accordance with the presently claimed invention, a sigma-delta (ΣΔ) difference-of-squares LOG-RMS to digital converter for true RMS detection is provided by merging a ΣΔ modulator with an analog LOG-RMS to DC converter based on a difference-of-squares. Chopper-stabilization, implemented through commutators running at two different frequencies, can be employed to reduce sensitivity to DC offsets and low-frequency errors, resulting in an extension of the useful input-referred dynamic range. High-order ΣΔ LOG-RMS converters can be implemented with a loop filter containing multiple integrators and feedforward and/or feedback paths for frequency compensation. The resulting implementations are ΣΔ difference-of-squares LOG-RMS to DC converters with a natural digital output and a logarithmically compressed dynamic range.

In accordance with one embodiment of the presently claimed invention, a sigma-delta difference-of-squares RMS-to-DC converter includes:

analog input signal router circuitry responsive to an analog input signal by providing first and second routed analog input signals related to the analog input signal;

first analog signal combining circuitry coupled to the analog input signal router circuitry and responsive to the first and second routed analog input signals and first and second routed analog feedback signals by providing first and second combined analog signals related to respective combinations of the first routed analog input and feedback signals and the second routed analog input and feedback signals, respectively;

analog signal multiplication circuitry coupled to the first analog signal combining circuitry and responsive to the first and second combined analog signals by providing an analog product signal including at least one signal component corresponding to a difference between a product of the first and second routed analog input signals and a product of the first and second routed analog feedback signals;

analog signal filter circuitry coupled to the analog signal multiplication circuitry and responsive to the analog product signal by providing a filtered analog signal;

analog-to-digital conversion (ADC) circuitry coupled to the analog signal filter circuitry and responsive to the filtered analog signal by providing a related digital output signal; and feedback signal conversion circuitry coupled between the ADC circuitry and the first analog signal combining circuitry, and responsive to the digital output signal by providing the first and second routed analog feedback signals, wherein the first and second routed analog feedback signals are related to the digital output signal in accordance with a defined nonlinear function.

In accordance with another embodiment of the presently claimed invention, a sigma-delta difference-of-squares RMS-to-DC converter includes:

analog input signal router means for routing an analog input signal as first and second routed analog input signals related to the analog input signal;

first analog signal combiner means for combining the first and second routed analog input signals and first and second routed analog feedback signals to provide first and second combined analog signals related to respective combinations of the first routed analog input and feedback signals and the second routed analog input and feedback signals, respectively;

analog signal multiplier means for multiplying the first and second combined analog signals to provide an analog product signal including at least one signal component corresponding to a difference between a product of the first and second routed analog input signals and a product of the first and second routed analog feedback signals;

analog signal filter means for filtering the analog product signal to provide a filtered analog signal;

analog-to-digital converter (ADC) means for converting the filtered analog signal to a related digital output signal; and feedback signal converter means for converting the digital output signal to the first and second routed analog feedback signals, wherein the first and second routed analog feedback signals are related to the digital output signal in accordance with a defined non-linear function.

In accordance with still another embodiment of the presently claimed invention, a method for performing a sigma-delta difference-of-squares RMS-to-DC conversion includes:

routing an analog input signal as first and second routed analog input signals related to the analog input signal;

combining the first and second routed analog input signals and first and second routed analog feedback signals to provide first and second combined analog signals related to respective combinations of the first routed analog input and feedback signals and the second routed analog input and feedback signals, respectively;

multiplying the first and second combined analog signals to provide an analog product signal including at least one signal component corresponding to a difference between a product of the first and second routed analog input signals and a product of the first and second routed analog feedback signals;

filtering the analog product signal to provide a filtered analog signal;

converting the filtered analog signal to a related digital output signal; and converting the digital output signal to the first and second routed analog feedback signals, wherein the first and second routed analog feedback signals are related to the digital output signal in accordance with a defined non-linear function.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed. Moreover, to the extent that the figures illustrate diagrams of the functional blocks of various embodiments, the functional blocks are not necessarily indicative of the division between hardware circuitry. Thus, for example, one or more of the functional blocks (e.g., processors, memories, etc.) may be implemented in a single piece of hardware (e.g., a general purpose signal processor, random access memory, hard disk drive, etc.). Similarly, any programs described may be standalone programs, may be incorporated as subroutines in an operating system, may be functions in an installed software package, etc.

The present invention comprises a new mixed-signal system for logarithmic RMS to digital conversion, named "ΣΔ difference-of-squares LOG-RMS to DC converter". Described below is the ΣΔ difference-of-squares LOG-RMS to DC converter with a forward path multiplier. Also described below is the use of chopping stabilization to improve the sensitivity of the ΣΔ LOG-RMS to digital converter. The small-signal analysis of ΣΔ difference-of-squares LOG-RMS to DC converters is described below. High-order ΣΔ difference-of-squares LOG-RMS to DC converters are discussed below.

Figure 10:
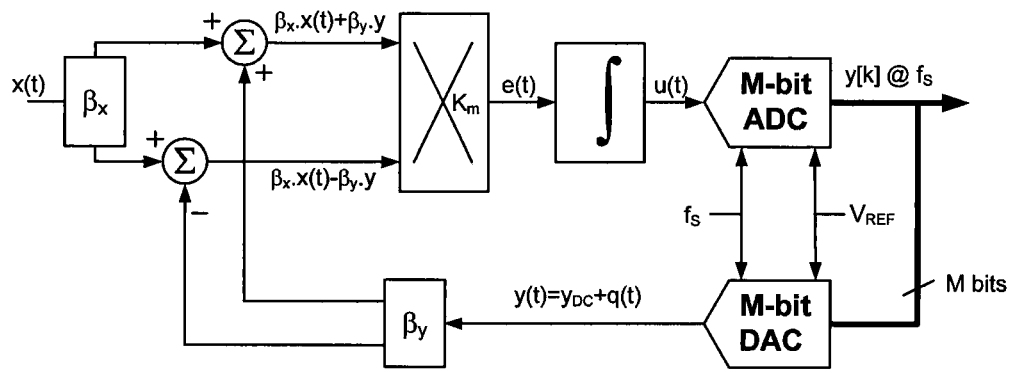
FIG. 10 depicts a ΣΔ difference-of-squares RMS-to-DC converter based on forward path multiplier.
Figure 11:
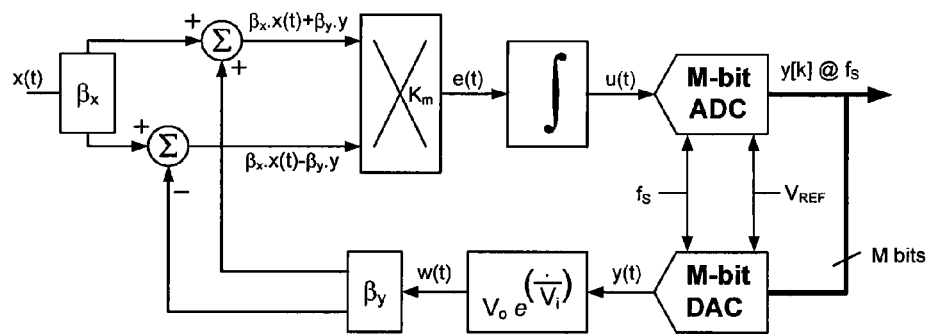
FIG. 11 depicts a ΣΔ difference-of-squares RMS to DC converter with (analog) exponential function in the feedback path.

The inclusion of an exponential function in the analog feedback path of a ΣΔ difference-of-squares RMS to DC converter (FIG. 10) transforms this mixed-signal system into a ΣΔ difference-of-squares LOG-RMS to DC converter (FIG. 11). In the simplest and most robust implementation of such a system, the feedback DAC and the analog exponential function are merged into a single building-block named exponential DAC, as depicted in FIG. 12.

Figure 12:
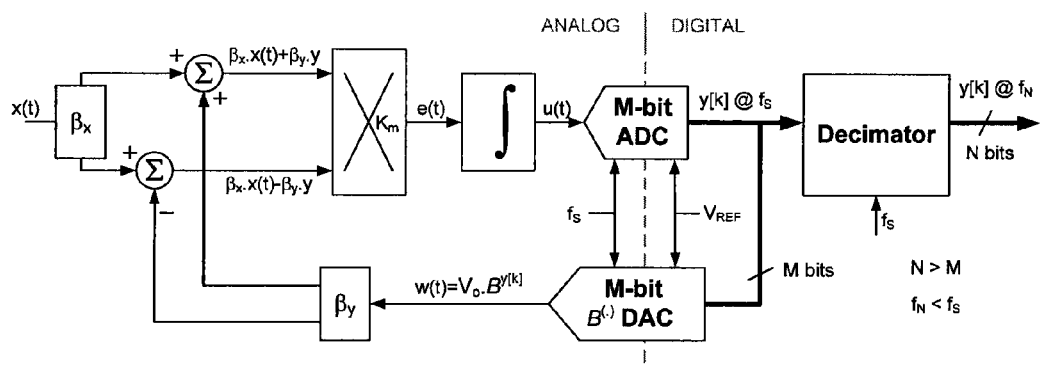
FIG. 12 depicts a ΣΔ difference-of-squares LOG-RMS to DC converter implemented with a forward-path multiplier and digital decimator.
Figure 13:
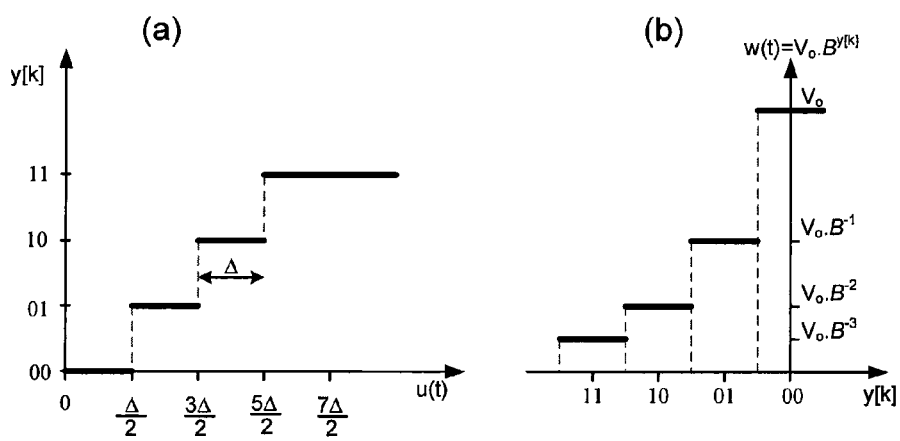
FIG. 13 depicts a 2-bit ADC in (a), and 2-bit B-base exponential DAC in (b).

FIG. 13 shows the generic transfer characteristics for the ADC and DAC employed in the ΣΔ difference-of-squares LOG-RMS to DC converter architecture depicted in FIG. 12. In this example, 2-bit quantization is employed. The ADC in (a) implements a conventional linear analog-to-digital conversion with equally spaced quantization levels. (Although shown as having a positive input range, a negative input range can be used as well.) The feedback DAC in (b) implements an exponential function $w(t)=V_o \cdot B^{y[k]}$, where the DAC base B equals $e^{-\Delta/V_i}$, $y[k]$ is a digitally encoded integer number, e is the base of the natural logarithm, $\Delta$ is the ADC quantization step and $V_i$ is the normalization factor in the argument of the analog exponential gain in FIG. 11. If the base B is an integer number, each exponentially spaced output DAC level can be implemented with an integer ratio of elements for best matching.

The complete LOG-RMS to digital converter is depicted in FIG. 12, where the difference-of-squares ΣΔ modulator is followed by a digital decimation filter and the feedforward integrator is represented by a generic lowpass loop filter with very high DC gain. The modulator output is an oversampled M-bit bitstream whose DC level is proportional to the logarithm of input RMS level. The digital decimator filters-out the high-frequency quantization noise and reduces the sampling-rate, at the same time producing a digital N-bit word with the converter's full nominal resolution.

The operation of the ΣΔ difference-of-squares LOG-RMS to DC converter is described as follows. The error signal e(t) is proportional to the difference between the squared input $x(t)^2$ and the squared analog feedback signal $w(t)^2$. The loop filter's high DC gain A forces the error signal e(t) to be zero at low frequencies and filters-out its high-frequency harmonics. The integrator output u(t), whose average is also proportional to the input signal LOG-RMS level, is digitized by the quantizer (M-bit ADC) and fed back by the exponential M-bit DAC. Mathematically, the description of the converter operation translates to:

$$\frac{u(t)}{A} = \overline{e(t)} = K_m(\beta_x^2 \cdot \overline{x(t)^2} - \beta_y^2 \overline{w(t)^2}) \qquad (19)$$

When A approaches infinity, expression (19) can be rewritten as:

$$\beta_x^2 \cdot \overline{x(t)^2} = \beta_y^2 \cdot \overline{w(t)^2} \qquad (20)$$

The LOG-RMS converter transfer characteristic can be obtained when the squared feedback signal $w(t)^2$ is expressed as a function of the digital output DC level $y_{DC}$:

$$w(t)^2 = (V_o \cdot B^{y[k]})^2 = V_o^2 \cdot (B^2)^{y[k]} \qquad (21)$$

Because the squaring of an exponential function is equivalent to a change of base, the LOG-RMS digital output $y[k]=y_{DC}+q(t)$ is not affected by the feedback squaring operation. Therefore, to a first-order, the converter DC output is independent of the quantization error mean-square value $q_{RMS}^2$. In the case of ΣΔ difference-of-squares linear RMS to DC converter, the value of $q_{RMS}^2$ defines the ideal lower limit of the converter's input-referred dynamic range.

In the case of ΣΔ difference-of-squares LOG-RMS to DC conversion, a better insight on the effect of the quantization error on the converter's performance is achieved when the feedback exponential function is replaced by its Taylor Series approximation. Assuming that the digital output $y[k]=y_{DC}+q(t)$ consists of a large-signal dominant component $y_{DC}$ and a small-signal quantization-error component q(t), the exponential function series expansion can be calculated around $y[k]=y_{DC}$:

$$w(t)^2\bigg|_{\overline{y}=y_{DC}} \cong V_o^2 \cdot (B^2)^{y_{DC}} \cdot \left(1 + \ln[B^2] \cdot q(t) + \frac{\ln[B^2]^2}{2} \cdot q(t)^2\right) \qquad (22)$$

If the quantization error q(t) is modeled as zero-average stochastic process with mean-square value $q_{RMS}^2$, the substitution of (22) into (20) becomes:

$$\beta_x^2 \cdot \overline{x(t)^2} = \beta_y^2 \cdot V_o^2 \cdot B^{2y_{DC}} \cdot (1 + 2\ln(B)^2 \cdot \overline{q(t)^2}) \qquad (23)$$

An expression relating the input RMS level $x_{RMS}$ and the digital output DC level $y_{DC}$ is obtained by solving (23):

$$y_{DC} = \log_B\left(\frac{\beta_x}{\beta_y} \cdot \frac{x_{RMS}}{V_o} \cdot \frac{1}{\sqrt{1 + 2\ln(B)^2 \cdot q_{RMS}^2}}\right) \qquad (24)$$

Expression (24) shows that $y_{DC}$ is proportional to the B-base logarithm of the input RMS level multiplied by a factor inversely proportional to the quantization error RMS level $q_{RMS}$. The law-conformance error is defined by the ratio between by the ideally measured RMS level and $y_{DC}$. For the LOG-RMS converter architecture depicted in FIG. 12, the law-conformance error (L.C.E.) due to the addition of quantization error inside the ΣΔ modulator is given by:

$$\text{L.C.E.} = \sqrt{1 + 2\ln(B)^2 \cdot q_{RMS}^2} \tag{25}$$

Figure 14:
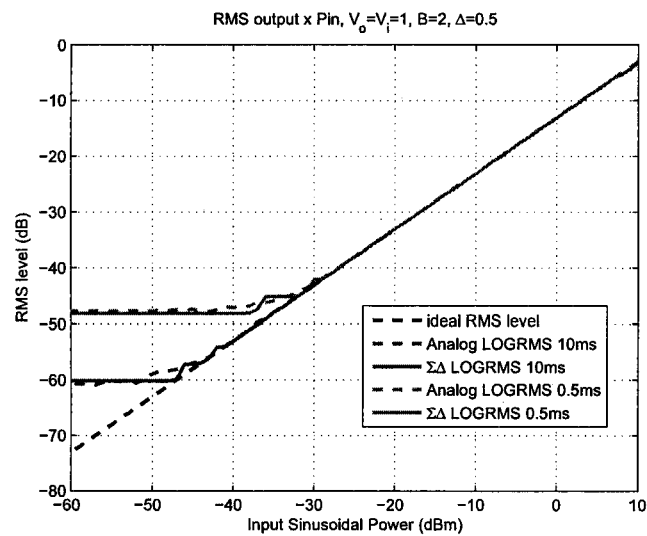
FIG. 14 depicts a ΣΔ difference-of-squares LOG-RMS to DC converter transfer curve, as a function of the time-domain simulation settling-time T.

FIG. 14 shows the simulated transfer curve of the ΣΔ difference-of-squares LOG-RMS to DC converter shown in FIG. 12. Each output data point $y_{RMS}=B^{yDC}$ in the transfer curve is obtained from a time-domain simulation, where the simulation time T is 500 μs or 10 ms. The ideal input RMS level is plotted as a dashed line and the ADC/DAC parameters are $f_S$=25 MHz, B=2 and Δ=0.5V. The computed RMS digital output follows closely the ideal input RMS level for all input power-levels where the LOG-RMS converter internal settling-time is smaller than the simulation time.

Figure 1:
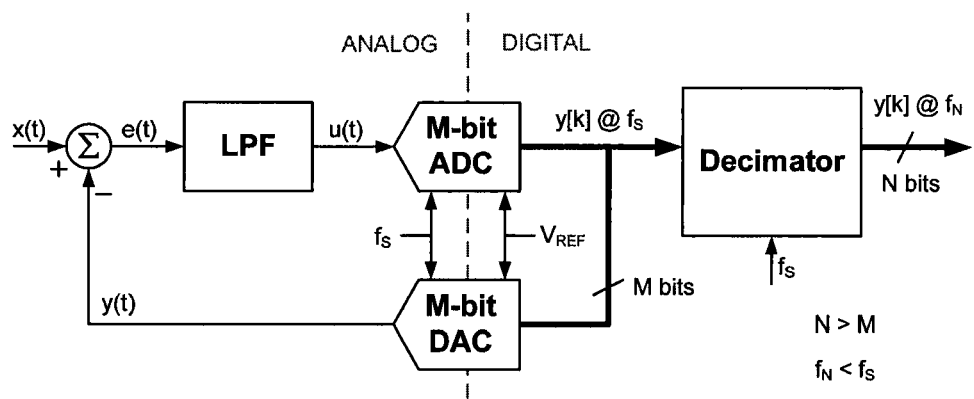
FIG. 1 depicts a ΣΔ modulator and digital decimator.
Figure 2:
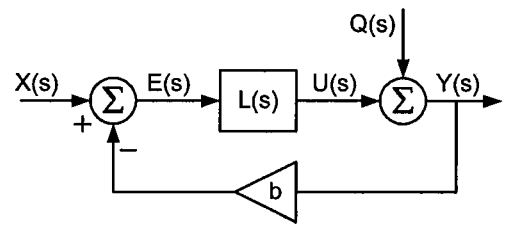
FIG. 2 depicts a ΣΔ modulator linear model.
Figure 3:
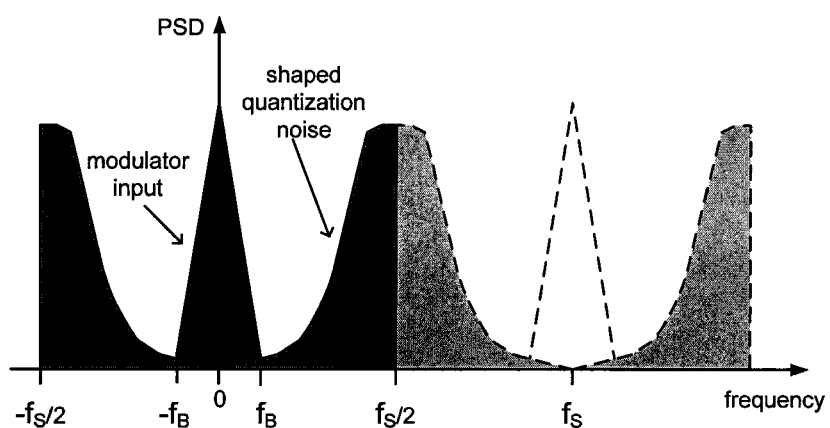
FIG. 3 depicts a typical output spectrum of a ΣΔ modulator.
Figure 4:
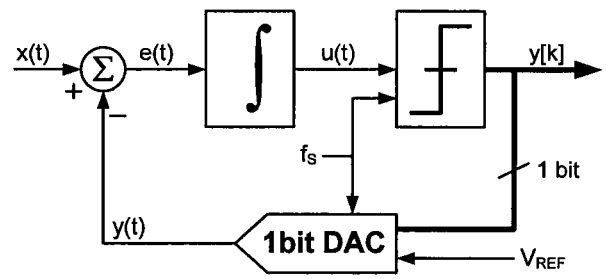
FIG. 4 depicts a single-bit 1st-order ΣΔ modulator.
Figure 5:
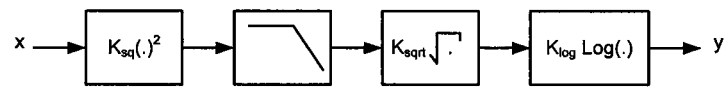
FIG. 5 depicts an explicit LOG-RMS to DC converter.
Figure 6:
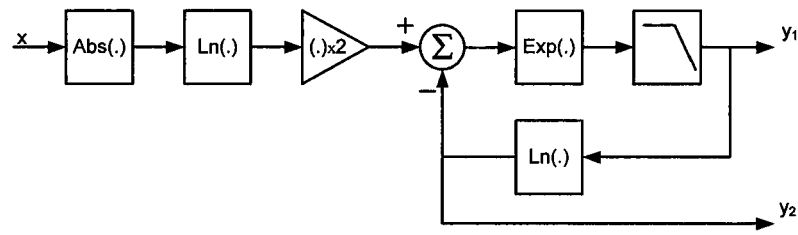
FIG. 6 depicts an implicit LOG-RMS to DC converter based on LOG-domain operations.
Figure 7:
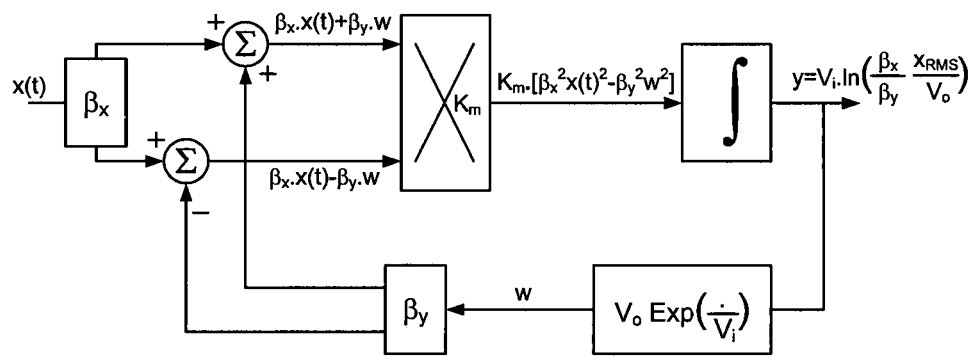
FIG. 7 depicts a difference-of-squares LOG-RMS to DC Conversion implemented with feedforward multiplication.
Figure 8:
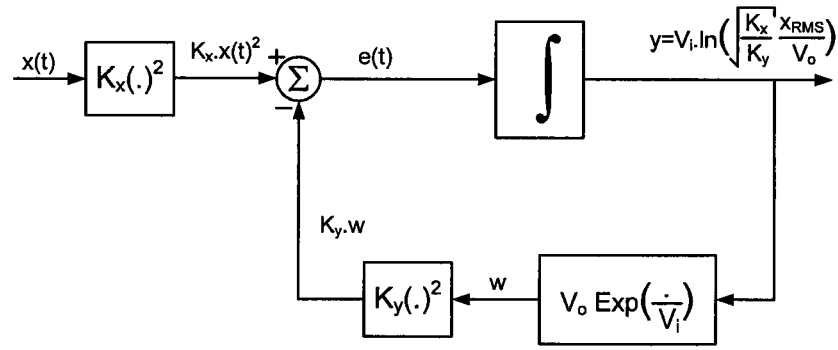
FIG. 8 depicts a difference-of-squares LOG-RMS to DC Conversion implemented with two squaring-cells.
Figure 9:
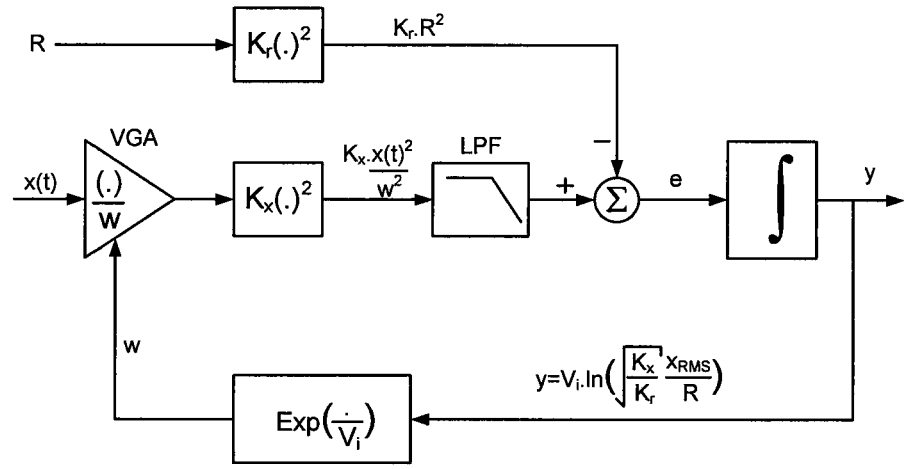
FIG. 9 depicts an implicit LOG-RMS to DC Conversion with a feedforward squaring cell driven by an exponential variable-gain function.
Figure 15:
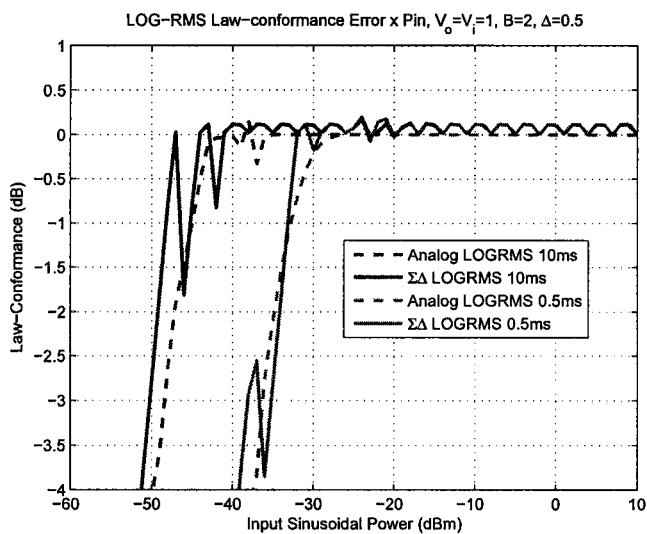
FIG. 15 depicts a ΣΔ difference-of-squares LOG-RMS to DC law-conformance error, as a function of the time-domain simulation time T.

Based on FIG. 14, the law-conformance error can be calculated by dividing the ideal RMS curve by the simulated transfer curves for T=500 μs and T=10 ms. The resulting law-conformance error plots are shown in FIG. 15. For the sake of comparison, the law-conformance error plots obtained from time-domain simulations (T=500 μs and T=10 ms) of an analog LOG-RMS difference-of-squares converter (FIG. 7) with the same internal time-constants and logarithmic base are also depicted. Where the settling-time required to achieve the steady-state situation is smaller than the simulation time, the law-conformance error is less than ±0.2 dB.

The comparison between the law-conformance error plots obtained from the analog and the ΣΔ LOG-RMS difference-of-squares converters also reveal that the internal quantization taking place inside the ΣΔ loop does not affect the converter settling-time. Therefore the converter minimum DC output, and consequently its useful input-referred dynamic range, is determined by the LOG-RMS converter internal time-constants and feedback exponential gain. The minimum required settling-time to achieve the steady-state situation is also inversely proportional to the input-power level. When the input-power level is too small, the simulation time becomes smaller than the required settling-time. In this case, expression (24) is no longer valid and the converter DC output clips to its minimum value.

Figure 16:
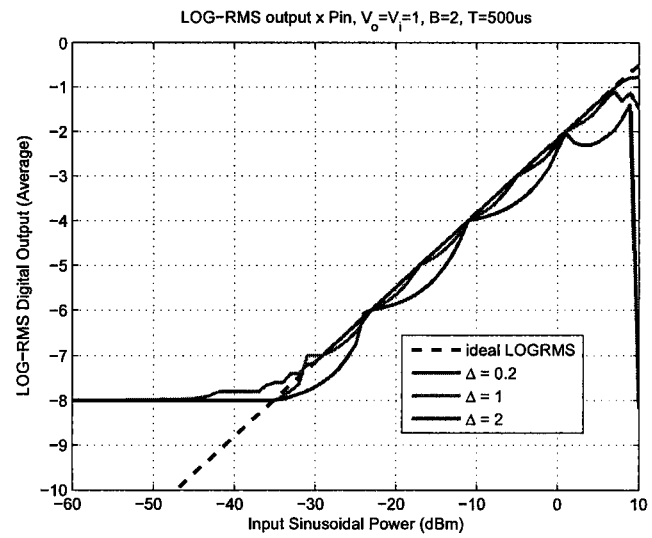
FIG. 16 depicts a ΣΔ difference-of-squares LOG-RMS to DC converter transfer curve, as a function of the internal ADC quantization step Δ.

A better insight in the behavior of ΣΔ difference-of-squares LOG-RMS to DC converter is obtained when the converter transfer curve is simulated for different values of the quantization step Δ. Those simulation results are plotted in FIG. 16.

When the quantization step becomes significant (e.g. Δ=1 or 2V) compared to the converter output DR, it is possible to notice that the simulated converter transfer curve is in fact a piece-wise approximation of the ideal LOG-RMS plot within the useful input-referred DR. The smaller the quantization step is, the better the simulated transfer curve approaches the ideal LOG-RMS plot. The piece-wise character of the ΣΔ LOG-RMS transfer characteristic can also be noticed in the law-conformance error plots shown in FIG. 17. The minimum DC output level depends only on the required/allowed settling-time. The maximum DC output level is a function of the saturation of the ΣΔ LOG-RMS converter internal building-blocks.

Figure 17:
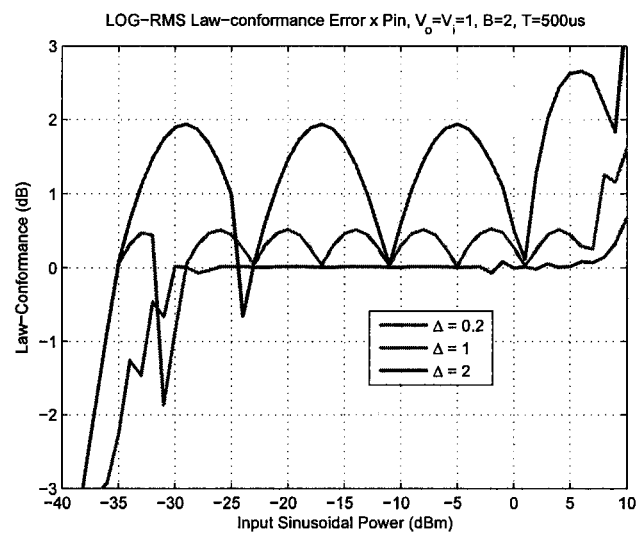
FIG. 17 depicts a ΣΔ difference-of-squares LOG-RMS to DC converter law-conformance error, as a function of the internal ADC quantization step Δ.

The law-conformance error plots shown in FIG. 17 present a clear periodicity. The peak value of the law-conformance error for every simulated Δ is (approximately) predicted by equation (25). However, the notches in the law-conformance error plots cannot be predicted by the mathematical model described above. These notches correspond to the points where the piece-wise LOG-RMS detector transfer curve is equal to the ideal LOG-RMS plot shown in FIG. 16. The law-conformance error is 0 dB (i.e. $q_{RMS}$=0) whenever the output LOG-RMS level equals precisely each possible output level of the M-bit quantizer. In other words, the law-conformance error is 0 dB for every input RMS level $x_{RMS}=B^{n\Delta}$ (where n is an integer number). That is the case for $P_{in}$=13 dBm, 1 dBm, −11 dBm, −23 dBm or −35 dBm when Δ=2V, as can be seen in FIG. 17.

In practice however, at low input power levels, the law-conformance error is also strongly dependent on DC offsets present in any physical implementation of RMS to DC converters.

ΣΔ difference-of-squares LOG-RMS to DC converters can also be implemented based on two squaring cells placed in the feedforward and in the feedback path, as described in a patent application filed concurrently herewith on behalf of the same inventors.

Figure 18:
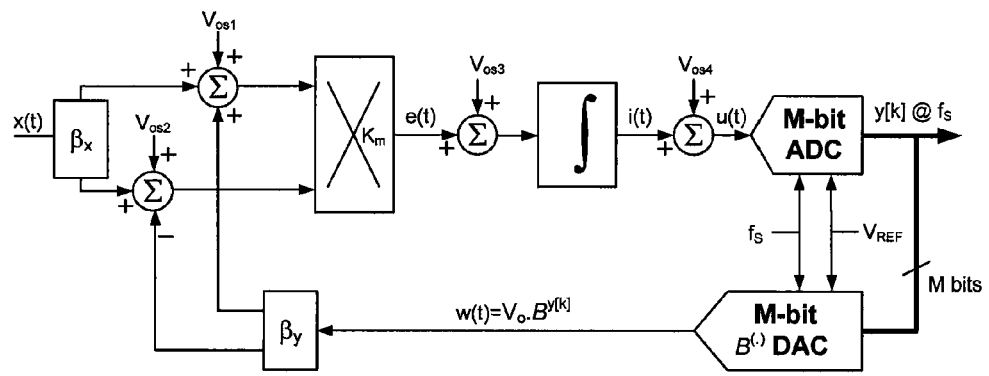
FIG. 18 depicts a ΣΔ difference-of-squares LOG-RMS to DC converter based on a forward multiplier and dominant offset sources.

All the information about the logarithm of the input RMS-level appears as a DC component in the digital output of a ΣΔ difference-of-squares LOG-RMS to DC converter. Therefore, for a measurement-time larger than the maximum required internal settling-time, the major causes of measurement inaccuracies are the internal sources of low-frequency errors present in any circuit implementation. FIG. 18 shows the block diagram of a ΣΔ LOG-RMS to DC converter based on a forward multiplier where the error sources are modeled by the addition of four offset voltages $V_{os}$ at critical nodes.

The effect of the offset voltages on the converter output can be calculated following the same methodology employed as discussed above. Mathematically, the multiplier output can be expressed as:

$$e(t) = K_m \cdot (\beta_x x(t) + \beta_y w(t) + V_{os1}) \cdot (\beta_x x(t) - \beta_y w(t) + V_{os2}) \tag{26}$$

When ΣΔ LOG-RMS to DC converter's internal states have reached a steady-state situation, the quantizer input u(t) can be expressed as a function of e(t), $V_{os3}$ and $V_{os4}$:

$$\frac{u(t) - V_{os4}}{A} = \tag{27}$$
$$V_{os3} + K_m \left[ \beta_x^2 \overline{x(t)^2} - \beta_y^2 \overline{w(t)^2} + V_{os1} V_{os2} + \beta_y \overline{w(t)}(V_{os2} - V_{os1}) \right]$$

For an integrator DC-gain A that approaches infinity, expression (27) can be rewritten as:

$$\frac{V_{os3}}{K_m} + \beta_x^2 \cdot \overline{x(t)^2} + V_{os1} V_{os2} = \beta_y^2 \cdot \overline{w(t)^2} + \beta_y \overline{w(t)}(V_{os1} - V_{os2}) \tag{28}$$

Therefore, whenever A is very high the effect of the offset voltage $V_{os4}$ in the converter output becomes negligible. The effect of the remaining offset voltages in the converter transfer characteristic can be estimated by solving (28). However, an analytical solution for (28) can only be found if w(t)= $V_o \cdot B^{y[k]}$ is replaced by a Taylor Series expansion around $y[k]=y_{DC}$. In this case, the following approximations can be employed:

$$\overline{w(t)} \cong V_o \cdot B^{yDC} \cdot \left(1 + \frac{\ln[B]^2}{2} \cdot q_{RMS}^2 \right) \tag{29}$$

$$\overline{w(t)^2} \cong V_o^2 \cdot B^{2yDC} \cdot (1 + 2 \cdot \ln[B]^2 \cdot q_{RMS}^2) \tag{30}$$

The substitution of (29) and (30) in (28) results in:

$$\frac{V_{os3}}{K_m} + \beta_x^2 \cdot x_{RMS}^2 + V_{os1}V_{os2} = P^2 \cdot q_2 + P \cdot q_1 \cdot (V_{os1} - V_{os2}) \quad (31)$$

where $P = \beta_y V_0 B^{y_{DC}}$ is an auxiliary variable, $q_1 = 1 + \frac{1}{2} \ln[B]^2 q_{RMS}^2$ and $q_2 = 1 + 2 \cdot \ln[B]^2 q_{RMS}^2$. The solution of the $2^{nd}$ degree equation (31) relating the variable P and the several system inputs is given by:

$$P = \frac{q_1}{q_2} \cdot \frac{V_{os2} - V_{os1}}{2} \pm \sqrt{\left(\frac{q_1}{q_2} \cdot \frac{V_{os2} - V_{os1}}{2}\right)^2 + \frac{V_{os3}/K_m + \beta_x^2 x_{RMS}^2 + V_{os1}V_{os2}}{q_2}} \quad (32)$$

The converter's digital output DC-level $y_{DC}$ can also be expressed as a function of P:

$$y_{DC} = \log_B(P/\beta_y V_0) \quad (33)$$

A final expression for $y_{DC}$ is obtained by substituting (32) into (33):

$$y_{DC} = \log_B\left(\frac{q_1}{q_2} \cdot \frac{V_{os2} - V_{os1}}{2V_0\beta_y} + \sqrt{\left(\frac{q_1}{q_2} \cdot \frac{V_{os2} - V_{os1}}{2V_0\beta_y}\right)^2 + \frac{V_{os3}/K_m + \beta_x^2 x_{RMS}^2 + V_{os1}V_{os2}}{V_0^2 \cdot \beta_y^2 \cdot q_2}}\right) \quad (34)$$

When the measurement time is larger than the maximum required internal settling-time, the minimum output DC-level in the ΣΔ LOG-RMS to DC converter's transfer characteristic determined by the magnitude of the remaining offset voltages $V_{os1}$, $V_{os2}$ and $V_{os3}$.

Figure 19:
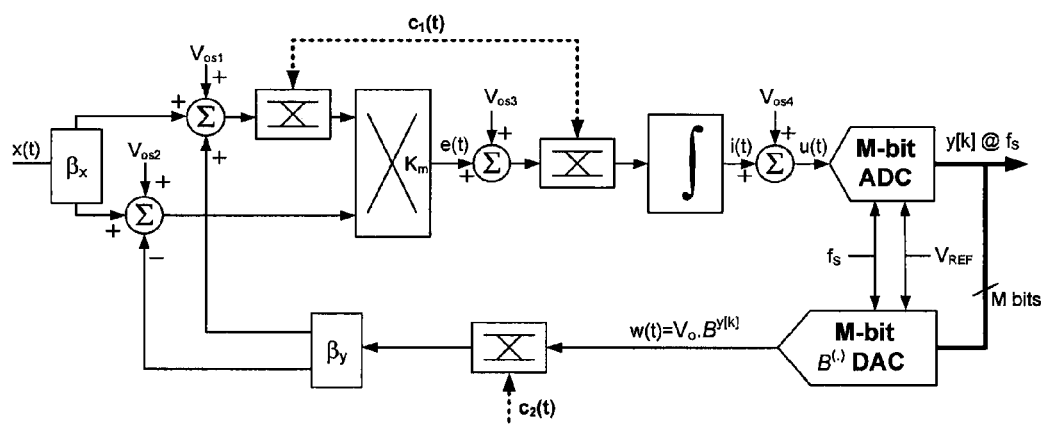
FIG. 19 depicts a ΣΔ difference-of-squares LOG-RMS to DC converter based on a forward multiplier employing choppers for offset reduction.

The strategy to reduce the ΣΔ difference-of-squares LOG-RMS to DC converter sensitivity to the remaining offset sources is to add choppers around the multiplier and in the feedback path, as depicted in FIG. 19. Chopper stabilization is a very effective technique to reduce the effect of offset errors in continuous-time circuits. It works by modulating the offset errors to frequencies far from DC, where the desired information (the logarithmic of the input RMS-level in this case) is located.

The choppers, or commutators, effectively multiply the processed signal by the sequence +1, −1, +1, etc. . . . The choppers controlled by $c_1(t)$ remove the offset $V_{os3}$ from DC. The first commutator is placed in one of the mixer inputs, while the second one is placed at the mixer output. The concept of this approach is referred to as a "Chopper Stabilized Analog Multiplier". The chopper controlled by $c_2(t)$, placed in the feedback path, removes $V_{os1}$ and $V_{os2}$ from DC. The extension of the offset cancellation approach in linear-RMS to DC converters to include a third chopper in the feedback path is referred to as an "RMS-DC converter with dual chopper offset cancellation".

For the architecture in FIG. 19, the integrator output i(t) in steady-state is given by:

$$\frac{i(t)}{A} = \overline{c_1(t)(V_{os3} + e(t))} = \\ \overline{c_1(t)}V_{os3} + c_1(t)^2 K_m\left[\beta_x^2\overline{x(t)^2} - \beta_y^2\overline{w(t)^2} + V_{os1}V_{os2} + \right. \\ \left. \beta_x\overline{x(t)}(V_{os2} + V_{os1}) + \beta_y\overline{c_2(t)w(t)}(V_{os2} - V_{os1})\right] \quad (35)$$

After being processed by the choppers, $V_{os3}$ is modulated to the frequency location $f_{c1}$, and $V_{os1}-V_{os2}$ is modulated to the frequency location $f_{c2}$. The term $V_{os1}+V_{os2}$ is modulated to the input-signal frequency. Therefore, the integrator bandwidth should be low enough to suppress the chopper frequencies $f_{c1}$ and $f_{c2}$, and the input RF $f_x$. Mathematically, the commutators' driving signals have the same following properties:

$$\overline{c_1(t)} = \overline{c_2(t)} = 0$$
$$c_1(t)^2 = c_2(t)^2 = C \quad (36)$$

where C represents an arbitrary constant different from zero. After the substitution of (36) into (35) all terms containing the offset voltages $V_{os1}$, $V_{os2}$ and $V_{os3}$ are zeroed, and the quantizer input u(t) can be expressed as a function of i(t) and $V_{os4}$:

$$\frac{u(t) - V_{os4}}{A \cdot K_m} = \beta_x^2\overline{x(t)^2} - \beta_y^2\overline{w(t)^2} + V_{os1}V_{os2} \quad (37)$$

When A approaches infinity, the effect of $V_{os4}$ in the converter output becomes negligible. In this case, the transfer characteristic for the chopper-stabilized ΣΔ LOG-RMS to DC converter can be calculated by substituting the approximation (30) in (37) and solving the resulting $2^{nd}$-degree analytical equation:

$$y_{DC} = \log_B\left(\sqrt{\frac{\beta_x^2 x_{RMS}^2 + V_{os1}V_{os2}}{V_0^2 \cdot \beta_y^2 \cdot [1 + 2\ln(B)^2 \cdot q_{RMS}^2]}}\right) \quad (38)$$

Figure 20:
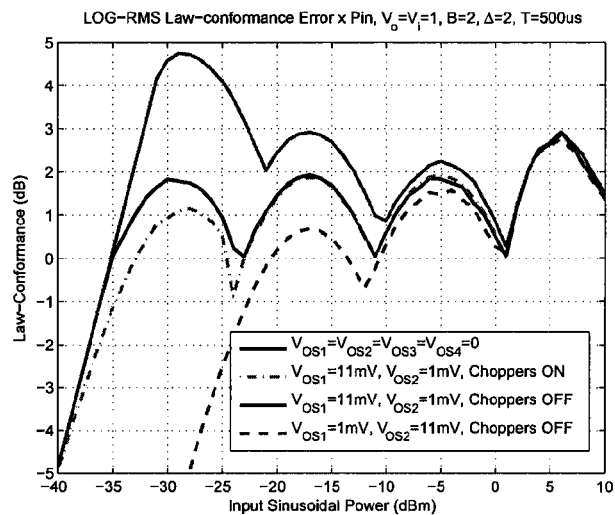
FIG. 20 depicts a chopper-stabilized ΣΔ difference-of-squares LOG-RMS to DC converter law-conformance error, with and without offset voltages Vos, with choppers turned ON or OFF.

The effectiveness of the chopper-stabilization techniques discussed herein were verified through a series of time-domain simulations (B=2, Δ=2, T=500 μs) of the ΣΔ LOG-RMS to DC converter architecture shown in FIG. 19. The results are depicted in FIG. 20 for four different situations: no internal offsets ($V_{os1}$=0), $V_{os1} > V_{os2}$ and choppers off, $V_{os1} < V_{os2}$ and choppers off, $V_{os1} \neq V_{os2}$ and choppers on.

When the choppers are off, the law-conformance error significantly diverges from the ideal case (no offsets) for small input-power levels. The polarity of the resulting output-offset depends on polarity of the term $V_{os2}-V_{os1}$ as predicted by expression (34). When the choppers are on, the law-conformance error follows closely the ideal situation. In this case, only a small residual offset proportional to $V_{os1}V_{os2}$ remains as predicted by (38).

Due to the three commutators added to the ΣΔ LOG-RMS to DC converter, the effects of the offsets $V_{os1}$, $V_{os2}$ and $V_{os3}$ in the converter output are completely eliminated. Only the second-order offset term $V_{os1} \cdot V_{os2}$ and the total power of the quantization error $q_{RMS}^2$ are left to limit the converter's accuracy.

In accordance with an alternative embodiment, such ΣΔ difference-of-squares RMS-to-DC converters can use dual feedback DACs instead of a single feedback DAC and signal router (e.g., signal divider) to produce the two analog feedback signals (e.g., as depicted in FIG. 7A of U.S. Pat. Nos. 7,545,302 and 7,545,303, the disclosures of which are incorporated herein by reference). Operation of the remainder of the circuitry remains the same.

In accordance with further alternative embodiments, the additional function in the feedback path, discussed above and further below as being an exponential function, can be in the form of virtually any linear or non-linear mathematical function, e.g., other than a linear scaling of the analog signal resulting from the digital-to-analog conversion of the digital output signal.

The total quantization error mean-square value $q_{RMS}^2$, that is always a function of the resolution of the internal quantizer, is the dominant factor determining the peak law-conformance error within the useful input-referred DR in ΣΔ LOG-RMS to DC converters. In the frequency domain, the added quantization error is also shaped by the ΣΔ modulator NTF. The ΣΔ LOG-RMS to DC converter STF and NTF can be calculated based on the small-signal model of the difference-of-squares ΣΔ modulator. Such a small-signal model can be obtained after the modulator internal states have reached a steady-state condition. In this situation, the non-linear building-blocks (multiplier and exponential feedback function) can be replaced by their equivalent small-signal gains. The multiplier's feedforward and feedback small-signal gains $k_x$ and $k_y$ are given by:

$$k_x = \frac{d}{dv}(K_m \cdot \beta_x^2 \cdot v^2)\bigg|_{v=x_{RMS}} = 2 \cdot K_m \cdot \beta_x^2 \cdot x_{RMS} \quad (39)$$

$$k_x = \frac{d}{dv}(K_m \cdot \beta_x^2 \cdot v^2)\bigg|_{v=x_{RMS}\frac{\beta_x}{\beta_y}} \quad (40)$$
$$= 2 \cdot K_m \cdot \sqrt{\beta_x^2 \cdot \beta_y^2} \cdot x_{RMS}$$
$$\cong 2 \cdot K_m \cdot \beta_x^2 \cdot x_{RMS}$$

The exponential function small-signal gain b is given by ($\beta_x = \beta_y$):

$$b = \frac{d}{dv}(V_o \cdot B^{v/V_i})\bigg|_{v=y_{DC}} = \ln(B) \cdot \frac{V_o}{V_i} \cdot B^{y_{DC}/V_i} = \ln(B) \cdot \frac{x_{RMS}}{V_i} \quad (41)$$

Figure 21:
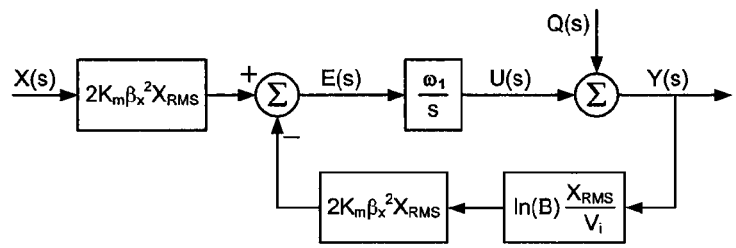
FIG. 21 depicts a 1st-order ΣΔ difference-of-squares LOG-RMS to DC converter linearized small-signal model.

FIG. 21 shows the resulting linearized Laplace-domain small-signal model for the $1^{st}$-order ΣΔ LOG-RMS to DC converter in FIGS. 11 and 12, valid for each different input-RMS level $x_{RMS}$ where $\omega_1$ is the radian unity gain frequency of the loop filter integrator and Q(s) is the additive quantization error source. The feedforward and feedback loop filter transfer functions $L_0(s)$ and $L_1(s)$ are respectively:

$$L_0(s) = \frac{U(s)}{X(s)} = 2K_m\beta_x^2 x_{RMS} \cdot \frac{\omega_1}{s} = k \cdot \frac{\omega_1}{s} \quad (42)$$

$$L_1(s) = \frac{U(s)}{Y(s)} = -\frac{2\ln(B)K_m\beta_x^2 x_{RMS}^2}{V_i} \cdot \frac{\omega_1}{s} = -kb\frac{\omega_1}{s} \quad (43)$$

Because the feedback loop filter $L_1(s)$ is a single-pole transfer function, the $1^{st}$-order ΣΔ LOG-RMS difference-of-squares modulators is always stable, independent of variations in the input power level. The modulator steady-state STF and NTF can be expressed as function of the loop filter transfer functions:

$$NTF = \frac{Y(s)}{Q(s)} = \frac{1}{1 - L_0(s)} = \frac{s}{s + kb \cdot \omega_1} \quad (44)$$

$$STF = \frac{Y(s)}{X(s)} = \frac{L_1(s)}{1 - L_0(s)} = \frac{k \cdot \omega_1}{s + kb \cdot \omega_1} \quad (45)$$

Figure 22:
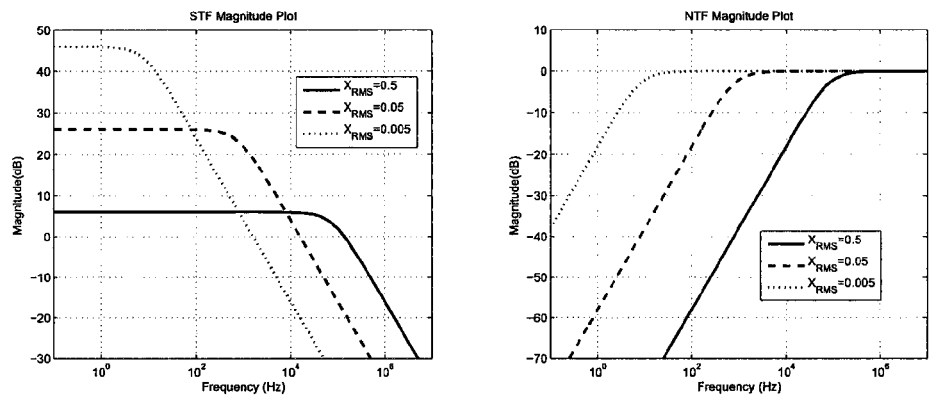
FIG. 22 depicts small-signal STF & NTF frequency responses for the 1st-order ΣΔ difference-of-squares LOG-RMS to DC converter (Km=1, Vo=Vi=1, B=e, $\omega_1$=106).

In the case of the $1^{st}$-order LOG-RMS difference-of-squares ΣΔ modulators, the corner frequency of both NTF and STF is proportional to the input power level. FIG. 22 shows the STF and NTF magnitude frequency responses for several input power levels and $\omega_1=1$ MHz.

Compared to ΣΔ linear-RMS to DC converters, two main differences arise. First, the NTF corner frequency changes proportionally to $x_{RMS}^2$ instead of only $x_{RMS}$. Second, the STF DC gain is now inversely proportional to $x_{RMS}$. Therefore, AC coupling is required at the ΣΔ LOG-RMS converter input and front-end circuitry in order to prevent amplification of low-frequency noise and DC-offset sources.

Figure 23:
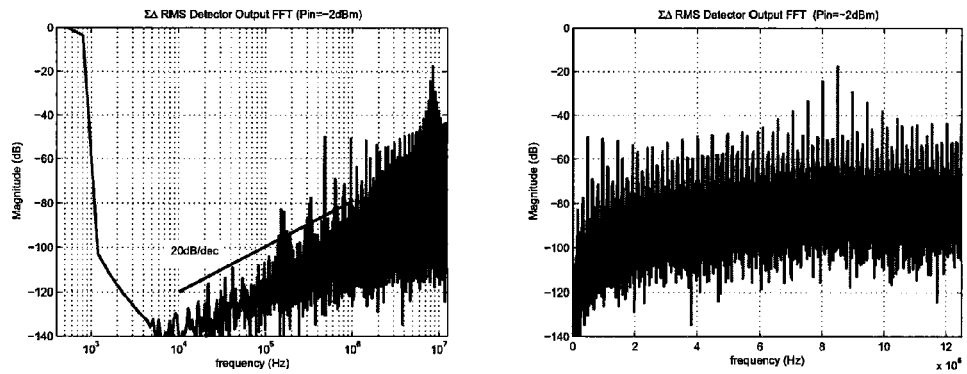
FIG. 23 depicts an output spectrum of a 1st-order ΣΔ difference-of-squares LOG-RMS to DC converter for □=1V, Pin=−2 dBm and fIN=550 MHz (Km=1, Vo=Vi=1V, B=2).

FIG. 23 shows the output spectrum of a $1^{st}$-order ΣΔ difference-of-squares LOG-RMS to DC converter employing a quantization step Δ=1V and logarithmic base B=2. The 62500-points digital output was obtained from a time-domain simulation with a sampling frequency ($f_S$) of 25 MHz and input power level $P_{in}=-2$ dBm. The 20 dB/dec slope noise-shaping and the strong tonal pattern typically found in the bitstream FFT of a $1^{st}$-order ΣΔ modulator can be easily recognized in FIG. 23. A high-resolution Nyquist-rate digital output can be obtained after the high-frequency quantization noise is filtered-out.

Figure 24:
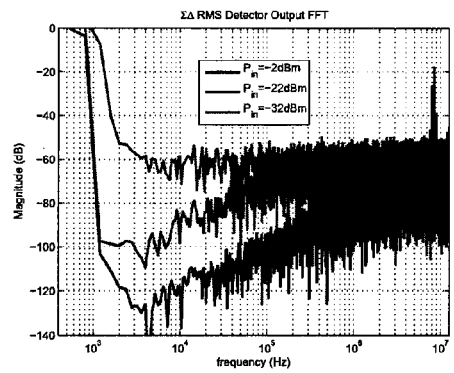
FIG. 24 depicts an output spectrum of a 1st-order ΣΔ difference-of-squares LOG-RMS to DC converter for Pin=−2 dBm, −22 dBm or −32 dBm (Km=1, Vo=Vi=1V, B=2, Δ=1V, $f_{IN}$=550 MHz).

FIG. 24 shows the output spectrum of the same $1^{st}$-order ΣΔ difference-of-squares LOG-RMS to DC converter for three different input power levels (Pin=−2 dBm, −22 dBm and −32 dBm). In these simulations, a white noise source was added at the quantizer input in order to make the effect of the reduced NTF low-frequency gain more easily noticeable. For very low input power levels, the gain of the feedback path is so small that there is almost no noise shaping and the output spectrum shows a flat power spectrum density (PSD).

Figure 25:
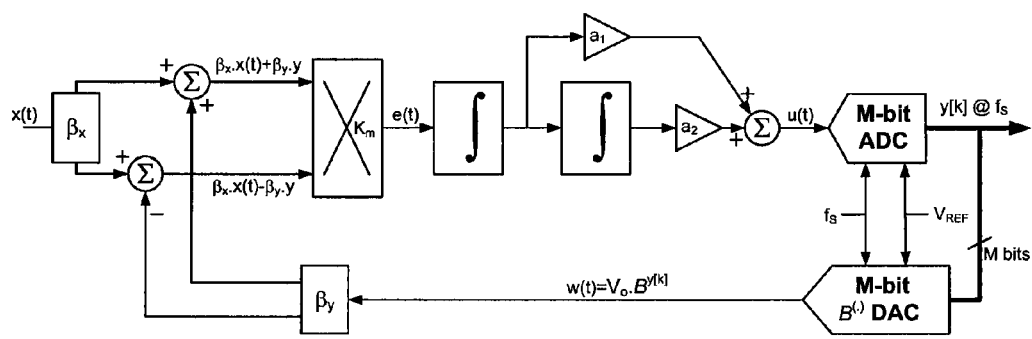
FIG. 25 depicts a 2nd order ΣΔ difference-of-squares LOG-RMS to DC converter implemented with a multiplier and 2 feedforward paths for frequency compensation.

Similar to conventional ΣΔ modulators, the quantization noise attenuation at low-frequencies can be increased in ΣΔ LOG-RMS to DC converters if the loop filter order is increased. In general, an $N^{th}$-order ΣΔ difference-of-squares LOG-RMS to DC converter contains N integrators in the loop filter. FIG. 25 shows a $2^{nd}$-order ΣΔ difference-of-squares LOG-RMS to DC converter implemented with a multiplier and two feedforward paths for frequency compensation. A stable $2^{nd}$-order ΣΔ LOG-RMS converter can also be implemented with multiple feedback paths, or with a combination of feedforward and feedback paths for frequency compensation.

Figure 26:
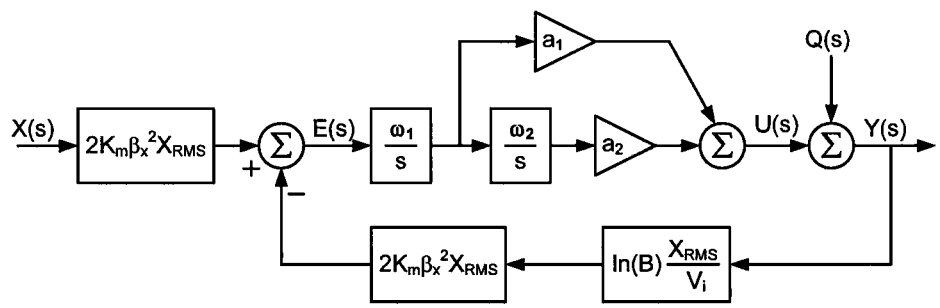
FIG. 26 depicts a 2nd-order ΣΔ difference-of-squares LOG-RMS to DC converter linearized small-signal model.

For every input RMS level $x_{RMS}$, after all internal states of the modulator have reached their steady-state levels, a linearized small-signal model in the Laplace domain (FIG. 26) of the $2^{nd}$-order architecture above described can be derived where $\omega_1$ and $\omega_2$ are the radian unity-gain frequencies of the loop filter integrators and Q(s) is the additive quantization error source. For the signal-dependent AC gains defined as $k=2K_m\beta_x^2X_{RMS}$ and $b=\ln(B)X_{RMS}/V_i$, the feedforward and feedback loop filter transfer functions $L_0(s)$ and $L_1(s)$ are respectively:

$$L_0(s) = \frac{U(s)}{X(s)} = k \cdot \frac{s \cdot a_1\omega_1 + a_2\omega_2\omega_1}{s^2} \quad (46)$$

-continued $$L_1(s) = \frac{U(s)}{Y(s)} = kb \cdot \frac{s \cdot a_1 \omega_1 + a_2 \omega_2 \omega_1}{s^2} \quad (47)$$

Because the feedback loop filter $L_1(s)$ is a two-pole system, the $2^{nd}$-order $\Sigma\Delta$ LOG-RMS difference-of-squares modulators is conditionally stable. In general, the stable operation of any $N^{th}$-order $\Sigma\Delta$ LOG-RMS converter (N>1) depends on the magnitude of the parameters $a_i$ and $\omega_i$, that is adequate for a certain range of possible sampling frequencies. The modulator steady-state small-signal STF and NTF can be expressed as function of the loop filter transfer functions:

$$NTF = \frac{Y(s)}{Q(s)} = \frac{1}{1 - L_0(s)} = \frac{s^2}{s^2 + s \cdot kb \cdot a_1 \omega_1 + kb \cdot a_2 \omega_2 \omega_1} \quad (48)$$

$$STF = \frac{Y(s)}{X(s)} = \frac{L_1(s)}{1 - L_0(s)} = \frac{s \cdot k \cdot a_1 \omega_1 + k \cdot a_2 \omega_2 \omega_1}{s^2 + s \cdot kb \cdot a_1 \omega_1 + kb \cdot a_2 \omega_2 \omega_1} \quad (49)$$

Figure 27:
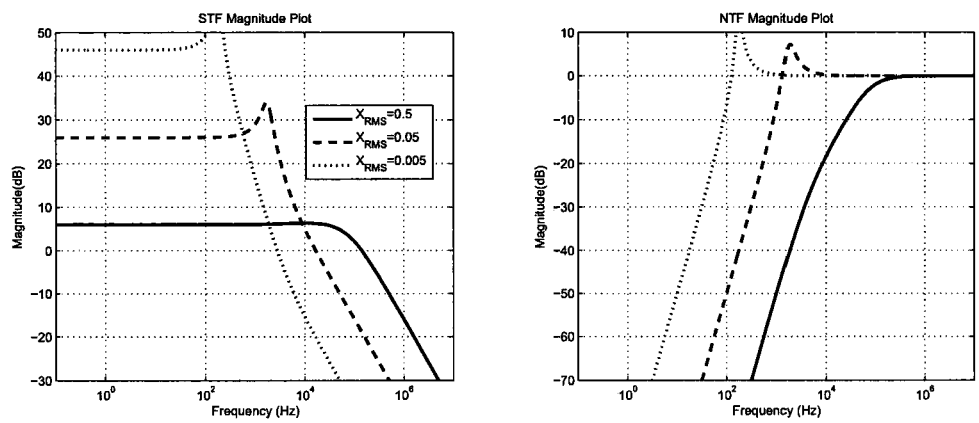
FIG. 27 depicts small-signal STF & NTF frequency responses for the 2nd-order ΣΔ difference-of-squares LOG-RMS to DC converter (Km=1, Vo=Vi=1, B=e, $a_2=a_1/4$, $\omega_1=10^6$, $\omega_2=10^5$).

FIG. 27 shows the STF and NTF magnitude frequency responses for several input power levels.

The $2^{nd}$-order NTF in expression (48) contains an extra zero at DC. The major advantage of $N^{th}$-order $\Sigma\Delta$ LOG-RMS converters is the fact that the implemented NTF contains N zeros at DC, what increases substantially the NTF low-frequency attenuation. Independent of the loop filter order, the STF DC gain is inversely proportional to $x_{RMS}$ and AC coupling is required at the $\Sigma\Delta$ LOG-RMS converter input and front-end circuitry in order to prevent amplification of low-frequency noise and DC-offset sources.

In order to decrease the sensitivity to DC-offsets and to further enlarge the input-referred dynamic range, chopper-stabilization techniques (discussed above) can be combined with high-order $\Sigma\Delta$ LOG-RMS converter architectures as described.

Based upon the discussion hereinabove, it can be seen that embodiments of the presently claimed invention provide a number of advantageous features including, without limitation, the following: a $\Sigma\Delta$ difference-of-squares LOG-RMS to digital converter employing internal quantization and a digital output, implemented with a forward path multiplier and a linear feedback DAC followed by an analog exponential conversion gain (e.g., as depicted in FIG. 11); a $\Sigma\Delta$ difference-of-squares LOG-RMS to digital converter employing internal quantization and a digital output, implemented with a forward path multiplier and an exponential feedback DAC (e.g., as depicted in FIG. 12); a chopper-stabilized $\Sigma\Delta$ difference-of-squares RMS-to-digital converter with extended dynamic range employing commutators around the multiplier and in the feedback path (e.g., as depicted in FIG. 19); and an Nth-order $\Sigma\Delta$ difference-of-squares RMS-to-digital converter built around a loop filter with N integrators, stabilized by multiple feedforward and/or feedback paths (e.g., as depicted in FIG. 25).

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a sigma-delta difference-of-squares RMS-to-DC converter, comprising:
    analog input signal router circuitry responsive to an analog input signal by providing first and second routed analog input signals related to said analog input signal;
    first analog signal combining circuitry coupled to said analog input signal router circuitry and responsive to said first and second routed analog input signals and first and second routed analog feedback signals by providing first and second combined analog signals related to respective combinations of said first routed analog input and feedback signals and said second routed analog input and feedback signals, respectively;
    analog signal multiplication circuitry coupled to said first analog signal combining circuitry and responsive to said first and second combined analog signals by providing an analog product signal including at least one signal component corresponding to a difference between a product of said first and second routed analog input signals and a product of said first and second routed analog feedback signals;
    analog signal filter circuitry coupled to said analog signal multiplication circuitry and responsive to said analog product signal by providing a filtered analog signal;
    analog-to-digital conversion (ADC) circuitry coupled to said analog signal filter circuitry and responsive to said filtered analog signal by providing a related digital output signal; and
    feedback signal conversion circuitry coupled between said ADC circuitry and said first analog signal combining circuitry, and responsive to said digital output signal by providing said first and second routed analog feedback signals, wherein said first and second routed analog feedback signals are related to said digital output signal in accordance with a defined non-linear function.

2. The apparatus of claim 1, wherein said defined non-linear function comprises an exponential function.

3. The apparatus of claim 1, wherein said feedback signal conversion circuitry comprises:
    digital-to-analog conversion (DAC) circuitry coupled to said ADC circuitry and responsive to said digital output signal by providing an analog feedback signal;
    non-linear signal conversion circuitry coupled to said DAC circuitry and responsive to said analog feedback signal by providing a converted feedback signal; and
    analog feedback signal router circuitry coupled to said non-linear signal conversion circuitry and responsive to said converted feedback signal by providing said first and second routed analog feedback signals.

4. The apparatus of claim 3, further comprising:
    first chopper circuitry coupled between a portion of said first analog signal combining circuitry and said analog signal multiplication circuitry, and responsive to one of said first and second combined analog signals by providing said one of said first and second combined analog signals as a first chopped signal;
    second chopper circuitry coupled between said analog signal multiplication circuitry and said analog signal filter circuitry, and responsive to said analog product signal by providing said analog product signal as a second chopped signal; and
    third chopper circuitry coupled between said non-linear signal conversion circuitry and said analog feedback signal router circuitry, and responsive to said converted feedback signal by providing said converted feedback signal as a third chopped signal.

5. The apparatus of claim 1, wherein said feedback signal conversion circuitry comprises:
  first digital-to-analog conversion (DAC) circuitry coupled to said ADC circuitry and responsive to said digital output signal by providing a first analog feedback signal;
  first non-linear signal conversion circuitry coupled to said first DAC circuitry and responsive to said first analog feedback signal by providing a first converted feedback signal as said first routed analog feedback signal;
  second DAC circuitry coupled to said ADC circuitry and responsive to said digital output signal by providing a second analog feedback signal; and
  second non-linear signal conversion circuitry coupled to said second DAC circuitry and responsive to said second analog feedback signal by providing a second converted feedback signal as said second routed analog feedback signal.

6. The apparatus of claim 5, further comprising:
  first chopper circuitry coupled between a portion of said first analog signal combining circuitry and said analog signal multiplication circuitry, and responsive to one of said first and second combined analog signals by providing said one of said first and second combined analog signals as a first chopped signal;
  second chopper circuitry coupled between said analog signal multiplication circuitry and said analog signal filter circuitry, and responsive to said analog product signal by providing said analog product signal as a second chopped signal;
  third chopper circuitry coupled between said first non-linear signal conversion circuitry and said first analog signal combining circuitry, and responsive to said first converted feedback signal by providing said first routed analog feedback signal as a third chopped signal; and
  fourth chopper circuitry coupled between said second non-linear signal conversion circuitry and said first analog signal combining circuitry, and responsive to said second converted feedback signal by providing said second routed analog feedback signal as a fourth chopped signal.

7. The apparatus of claim 1, wherein said feedback signal conversion circuitry comprises:
  non-linear digital-to-analog conversion (DAC) circuitry coupled to said ADC circuitry and responsive to said digital output signal by providing an analog feedback signal; and
  analog feedback signal router circuitry coupled to said non-linear DAC circuitry and responsive to said analog feedback signal by providing said first and second routed analog feedback signals.

8. The apparatus of claim 7, further comprising:
  first chopper circuitry coupled between a portion of said first analog signal combining circuitry and said analog signal multiplication circuitry, and responsive to one of said first and second combined analog signals by providing said one of said first and second combined analog signals as a first chopped signal;
  second chopper circuitry coupled between said analog signal multiplication circuitry and said analog signal filter circuitry, and responsive to said analog product signal by providing said analog product signal as a second chopped signal; and
  third chopper circuitry coupled between said non-linear signal DAC circuitry and said analog feedback signal router circuitry, and responsive to said analog feedback signal by providing said analog feedback signal as a third chopped signal.

9. The apparatus of claim 1, wherein said feedback signal conversion circuitry comprises:
  first non-linear digital-to-analog conversion (DAC) circuitry coupled to said ADC circuitry and responsive to said digital output signal by providing said first routed analog feedback signal; and
  second non-linear DAC circuitry coupled to said ADC circuitry and responsive to said digital output signal by providing said second routed analog feedback signal.

10. The apparatus of claim 9, further comprising:
  first chopper circuitry coupled between a portion of said first analog signal combining circuitry and said analog signal multiplication circuitry, and responsive to one of said first and second combined analog signals by providing said one of said first and second combined analog signals as a first chopped signal;
  second chopper circuitry coupled between said analog signal multiplication circuitry and said analog signal filter circuitry, and responsive to said analog product signal by providing said analog product signal as a second chopped signal;
  third chopper circuitry coupled between said first non-linear DAC circuitry and said first analog signal combining circuitry, and responsive to said first routed analog feedback signal by providing said first routed analog feedback signal as a third chopped signal; and
  fourth chopper circuitry coupled between said second non-linear DAC circuitry and said first analog signal combining circuitry, and responsive to said second routed analog feedback signal by providing said second routed analog feedback signal as a fourth chopped signal.

11. The apparatus of claim 1, wherein said analog signal filter circuitry comprises:
  first filter circuitry coupled to said analog signal multiplication circuitry and responsive to said analog product signal by providing a first intermediate signal;
  second filter circuitry coupled to said first filter circuitry and responsive to said first intermediate signal by providing a second intermediate signal;
  amplifier circuitry coupled to said first filter circuitry and responsive to said first intermediate signal by providing a third intermediate signal; and
  second analog signal combining circuitry coupled to said second filter circuitry and said amplifier circuitry, and responsive to said second and third intermediate signals by providing said filtered analog signal.

12. The apparatus of claim 11, wherein said feedback signal conversion circuitry comprises:
  digital-to-analog conversion (DAC) circuitry coupled to said ADC circuitry and responsive to said digital output signal by providing an analog feedback signal;
  non-linear signal conversion circuitry coupled to said DAC circuitry and responsive to said analog feedback signal by providing a converted feedback signal; and
  analog feedback signal router circuitry coupled to said non-linear signal conversion circuitry and responsive to said converted feedback signal by providing said first and second routed analog feedback signals.

13. The apparatus of claim 11, wherein said feedback signal conversion circuitry comprises:
  first digital-to-analog conversion (DAC) circuitry coupled to said ADC circuitry and responsive to said digital output signal by providing a first analog feedback signal;
  first non-linear signal conversion circuitry coupled to said first DAC circuitry and responsive to said first analog feedback signal by providing a first converted feedback signal as said first routed analog feedback signal;

second DAC circuitry coupled to said ADC circuitry and responsive to said digital output signal by providing a second analog feedback signal; and second non-linear signal conversion circuitry coupled to said second DAC circuitry and responsive to said second analog feedback signal by providing a second converted feedback signal as said second routed analog feedback signal.

14. The apparatus of claim 11, wherein said feedback signal conversion circuitry comprises:

non-linear digital-to-analog conversion (DAC) circuitry coupled to said ADC circuitry and responsive to said digital output signal by providing an analog feedback signal; and analog feedback signal router circuitry coupled to said non-linear DAC circuitry and responsive to said analog feedback signal by providing said first and second routed analog feedback signals.

15. The apparatus of claim 11, wherein said feedback signal conversion circuitry comprises:

first non-linear digital-to-analog conversion (DAC) circuitry coupled to said ADC circuitry and responsive to said digital output signal by providing said first routed analog feedback signal; and second non-linear DAC circuitry coupled to said ADC circuitry and responsive to said digital output signal by providing said second routed analog feedback signal.

16. An apparatus including a sigma-delta difference-of-squares RMS-to-DC converter, comprising:

analog input signal router means for routing an analog input signal as first and second routed analog input signals related to said analog input signal;

first analog signal combiner means for combining said first and second routed analog input signals and first and second routed analog feedback signals to provide first and second combined analog signals related to respective combinations of said first routed analog input and feedback signals and said second routed analog input and feedback signals, respectively;

analog signal multiplier means for multiplying said first and second combined analog signals to provide an analog product signal including at least one signal component corresponding to a difference between a product of said first and second routed analog input signals and a product of said first and second routed analog feedback signals;

analog signal filter means for filtering said analog product signal to provide a filtered analog signal;

analog-to-digital converter (ADC) means for converting said filtered analog signal to a related digital output signal; and feedback signal converter means for converting said digital output signal to said first and second routed analog feedback signals, wherein said first and second routed analog feedback signals are related to said digital output signal in accordance with a defined non-linear function.

17. A method for performing a sigma-delta difference-of-squares RMS-to-DC conversion, comprising:

routing an analog input signal as first and second routed analog input signals related to said analog input signal;

combining said first and second routed analog input signals and first and second routed analog feedback signals to provide first and second combined analog signals related to respective combinations of said first routed analog input and feedback signals and said second routed analog input and feedback signals, respectively;

multiplying said first and second combined analog signals to provide an analog product signal including at least one signal component corresponding to a difference between a product of said first and second routed analog input signals and a product of said first and second routed analog feedback signals;

filtering said analog product signal to provide a filtered analog signal;

converting said filtered analog signal to a related digital output signal; and converting said digital output signal to said first and second routed analog feedback signals, wherein said first and second routed analog feedback signals are related to said digital output signal in accordance with a defined non-linear function.

\* \* \* \* \*